United States Patent [19]
Park et al.

[11] Patent Number: 5,574,296
[45] Date of Patent: Nov. 12, 1996

[54] DOPING OF IIB-VIA SEMICONDUCTORS DURING MOLECULAR BEAM EPITAXY ELECTROMAGNETIC RADIATION TRANSDUCER HAVING P-TYPE ZNSE LAYER

[75] Inventors: Robert M. Park, Gainesville, Fla.; James M. DePuydt, St. Paul, Minn.; Hwa Cheng; Michael A. Haase, both of Woodbury, Minn.

[73] Assignee: Minnesota Mining And Manufacturing Company, St. Paul, Minn.

[21] Appl. No.: 95,872

[22] Filed: Jul. 21, 1993

Related U.S. Application Data

[62] Division of Ser. No. 573,428, Aug. 24, 1990, Pat. No. 5,248,631.

[51] Int. Cl.$^6$ .......................... H01L 33/00; H01L 29/22; H01L 31/0328; H01L 31/00
[52] U.S. Cl. .......................... 257/103; 257/78; 257/94; 257/201; 257/442; 257/614
[58] Field of Search .................. 257/78, 94, 103, 257/200, 201, 613, 614, 442

[56] References Cited

U.S. PATENT DOCUMENTS

| | | | |
|---|---|---|---|
| 3,735,212 | 5/1973 | Kun ......................................... | 257/103 |
| 3,745,073 | 7/1973 | Kun et al. .............................. | 257/103 |
| 4,081,764 | 3/1978 | Christmann et al. ................. | 331/94.5 |
| 4,735,910 | 4/1988 | Mitsuyu et al. ........................ | 437/22 |
| 4,866,007 | 9/1989 | Taguchi et al. ........................ | 437/108 |
| 5,103,269 | 4/1992 | Tomomura et al. ..................... | 257/78 |
| 5,150,191 | 9/1992 | Motegi et al. .......................... | 257/103 |

FOREIGN PATENT DOCUMENTS

| | | |
|---|---|---|
| 61-117199 | 10/1986 | Japan . |
| 62-172766 | 7/1987 | Japan . |
| 63-303899 | 12/1988 | Japan . |
| 2262380 | 10/1990 | Japan .................................... 257/103 |

OTHER PUBLICATIONS

"n-Type and p-Type Conductivity Control of ZnSe Grown by Metalorganic Molecular Beam Epitaxy Using Metholiodide and Ammonia," M. Migita et al, *Journal of Crystal Growth III*, 1991, pp. 776–781.

R. M. Park, M. B. Troffer, C. M. Rouleau, J. M. DePuydt, and M. A. Haase, P–Type ZnSe By Nitrogen Atom Beam Doping During Molecular Beam Epitaxial Growth; Applied Physics Letters, American Institute of Physics–New York; vol. 57, No. 20; Nov. 12, 1990; pp. 2127–2129.

Journal of Crystal Growth; Mashito Migita et al.; vol. 101; No. 1/4; Apr. 1, 1990; Amsterdam, NL; P–Type Conduction of ZnSe Highly Doped with Nitrogen by Metalorganic Molecular Beam Epitaxy; pp. 835–840.

Journal of Crystal Growth; Hiroshi Kukimoto; vol. 101; No. 1/4; Apr. 1, 1990; Amsterdam, NL; Conductivity Control of ZnSe Grown by Movpe and its Application for Blue Electroluminescence; pp. 953–957.

Solar Cells; N. Romeo et al.; vol. 26; No. 3; Mar. 1989; P–type CdTe Thin Films Doped During Growth by Neutral High Energy Nitrogen Atoms; pp. 189–195.

A. Taike, M. Migita, & H. Yamamoto; P–Type Conductivity Control of ZnSe Highly Doped with Nitrogen by Metalorganic Molecular Beam Epitaxy; May 14, 1990; Applied Physics Letters; vol. 56, No. 20; pp. 1989–1991.

(List continued on next page.)

*Primary Examiner*—Mahshid Saadat
*Attorney, Agent, or Firm*—Gary L. Griswold; Walter N. Kirn; Lorraine R. Sherman

[57] ABSTRACT

An electromagnetic radiation transducer is provided having a p-type ZnSe layer and an n-type layer. The p-type ZnSe layer has a net donor to net acceptor ratio ($N_D/N_A$) of less than or equal to about 0.8. The net acceptor concentration is greater than about $5 \times 10^{15}$ cm$^{-3}$ and the resistivity is less than 15 Ω-cm. The p-type ZnSe layer is deposited by doping the ZnSe during fabrication with a neutral free-radical source.

21 Claims, 9 Drawing Sheets

OTHER PUBLICATIONS

R. Clampitt & P. E. Hanley; Oxidation of Cold Copper Films with Oxygen Radicals; 1988; Super Conductor Science Technology; pp. 5 & 6.

Katsuhiro Akimoto, Takao Miyajima, & Yoshifumi Mori; Electroluminescence in an Oxygen–Doped ZnSe P–N Junction Grown by Molecular Beam Epitaxy; Apr. 1989; Japanese Journal of Applied Physics; vol. 28, No. 4; pp. L531–L534.

T. Mitsuyu, K. Ohkawa, & O. Yamazaki; Photoluminescence Properties of Nitrogen–Doped ZnSe Layers Grown by Molecular Beam Epitaxy with Low–Energy Ion Doping; Nov. 17, 1986; Applied Physics Letters; vol. 49; No. 20; pp. 1348–1350.

J. M. DePuydt, M. A. Haase, H. Cheng, & J. E. Potts; Electrical Characterization of P–Type ZnSe; Sep. 11, 1989; Applied Physics Letters; vol. 55, No. 11; pp. 1103–1105.

R. M. Park, H. A. Mar, & N. M. Salansky; Photoluminescence Properties of Nitrogen–Doped ZnSe Grown by Molecular Beam Epitaxy; Jul. 15, 1985; Journal of Applied Physics; vol. 52; No. 2; pp. 1047–1049.

M. A. Haase, H. Cheng, J. M. DePuydt, & J. E. Potts; Characterization of P–Type ZnSe; Jan. 1, 1990; Journal of Applied Physics; vol. 67; No. 1; pp. 448–452.

Ikuo Suemune, Kouichi Yamada, Hiroyuki Masato, Takashi Kanda, Yasou Kan, & Masamichi Yamanishi, Characterization of Nitrogen–Doped $ZnS_{0.06}Se_{0.94}$ Films Grown by Metal–Organic Vapor–Phase Epitaxy; Nov. 1988; Japanese Journal of Applied Physics; vol. 27, No. 11; pp. L2195–L2198.

R. M. Park; C. M. rouleau, & M. B. Troffer; Strain–Free, Ultra–High Purity ZnSe Layers Grown by Molecular Beam Epitaxy; Mar. 1909; Journal of Materials Research; vol. 5, No. 3; pp. 475–477.

Khalid Shahzad, Diego J. Olego, & David A. Cammack; Optical Transitions in Ultra–High–Purity Zinc Selenide; Jun. 15, 1989; The American Physical Society; vol. 39, pp. 13016–13019.

P. J. Dean, W. Stutuius, G. F. Neumark, B. J. Fitzpatrick, & R. N. Bhargava; Ionization Energy of the Shallow Nitrogen Acceptor in Zinc Selenide; Feb. 15, 1983; American Physical Society; vol. 27, No. 4; pp. 2419–2428.

L. Kassel; H. Abad, J. W. Garland, & P. M. Raccah, and J. E. Potts, M. A. Haase, & H. Cheng; Study of the Interface of Undoped and P–Doped ZnSe with GaAs and AlAs; Jan. 1, 1990; Applied Physics Letters; pp. 42–44.

Katsuhiro Akimoto; Takao Miyajima, & Yoshufumi Mori; Electroluminescence from A ZnSe P–N Junction Fabricated by Nitrogen–Ion Implantation; Apr. 1989; Japanese Journal of Applied Physics; vol. 28, No. 4, pp. L528–L530.

State University System of Florida; UF/3M Company Collaborate on ZnSe Blue Led Development; Jul. 1990; Advanced Microelectronics and Materials Program; vol. 1, No. 4; pp. 1 and 8.

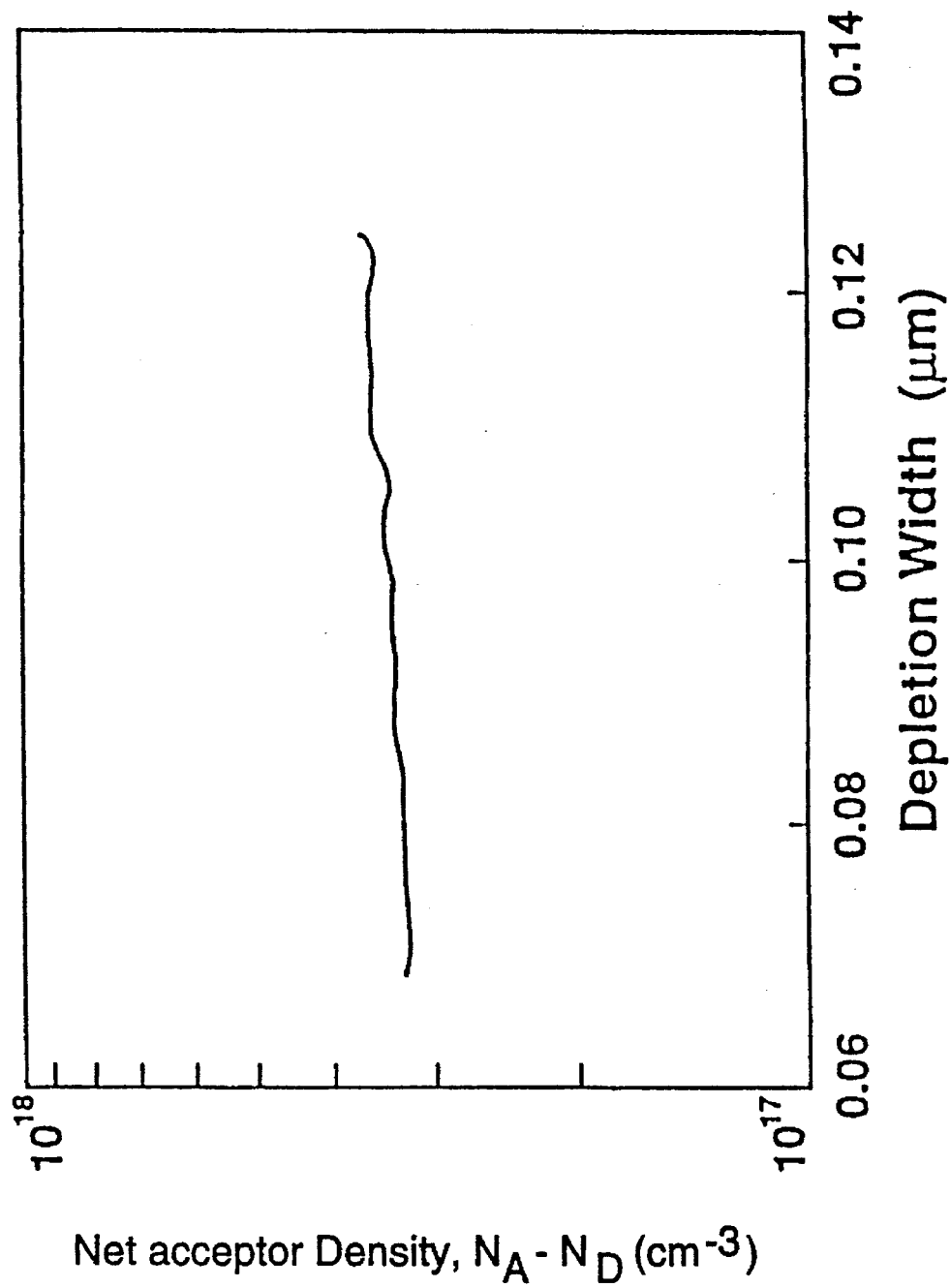

DOPING OF IIB-VIA SEMICONDUCTORS DURING MOLECULAR BEAM EPITAXY ELECTROMAGNETIC RADIATION TRANSDUCER HAVING P-TYPE ZNSE LAYER

The U.S. Government has certain rights in this invention pursuant to Grant Number 90-214-MSS-89-09281 awarded by the NSF and Grant Number MDA-972-88-J-1006 awarded by DARPA.

This is a Divisional of application Ser. No. 07/573,428, filed Aug. 24, 1990 now U.S. Pat. No. 5,248.631.

BACKGROUND OF THE INVENTION

The present invention relates to doping IIB-VIA semiconductors during molecular beam epitaxy. In particular the invention relates to doping IIB-ViA semiconductors with group VA or oxygen free-radicals.

Molecular beam epitaxy is a deposition process in which atomic or molecular beams are used to deposit a film of material upon a substrate. In the past, doping IIB-VIA semiconductors with group VA elements using molecular beam epitaxy, or other deposition processes, has not been very successful. Typically, the resulting structure has a net acceptor concentration which is too low for most uses.

Light emitting diodes and semiconductor lasers are used in many electronic and optoelectronic systems such as communication, recording and display systems. Most of the current light emitting diodes and all the semiconductor lasers emit light in the infrared and red regions of the electromagnetic spectrum. It is desirable to have available shorter wavelength light emitting diodes and laser diodes. Blue and green light emitting diodes and lasers are necessary elements in full color displays; would permit increased recording densities in optical recording systems; would provide improved underwater communications; and could be used in plastic fiber based local area networks. Currently there exist no blue or green laser diodes and the available short wavelength light emitting diodes such as SiC and GaN are both costly and inefficient.

IIB-VIA semiconductors are well suited for the production of visible light emitters since their bandgap energies cover the visible spectrum and they have large radiative efficiencies. The fabrication of light emitting diodes and lasers requires the availability of both n-type and p-type material. Unfortunately, it is very difficult to p-type dope the large bandgap IIB-VIA semiconductors. A notable exception is ZnTe which can only be doped p-type.

Some progress with p-type doping of the large bandgap IIB-VIA materials by molecular beam epitaxy has recently been reported (for example, see J. M. DePuydt, M. A. Haase, H. Cheng and J. E. Potts, Appl. Phys. Lett. 55 (11), 11 Sep. 1989, p. 1103–1105); K. Akimoto, T. Miyajima and Y. Mori, Jpn. Journ. Appl. Phys. 28 (4), 4 Apr. 1989, p. L531–534). The net acceptor densities achieved, however, are low and thus inadequate for the fabrication of efficient light emitting devices. Furthermore, the dopants are not desirable for other reasons. Desirable impurities for p-type doping of IIB-VIA's are the group VA elements (N, P, As and Sb). Past attempts at doping with the group VA elements, however, have shown that it is difficult to incorporate sufficient concentrations of these impurities by molecular beam epitaxy (see R. M. Park, H. A. Mar and N. M. Salansky, J. Appl. Phys. 58 (2), 15 Jul. 1985, p. 1047–1049) or that appreciable damage is inflicted to the crystal during growth (see T. Mitsuyu, K. Ohkawa and O. Yamazaki, Appl. Phys. Lett. 49 (20), 17 Nov. 1986, p. 1348–1350).

In terms of efforts to incorporate substitutional acceptor impurities in ZnSe epitaxial layers during crystal growth, the highest degree of reported success, until very recently, concerned Li-doping during molecular beam epitaxial growth (see M. A. Haase, H. Cheng, J. M. Depuydt, and J. E. Potts, J. Appl. Phys., 67, 448 (1990)). Two major problems, however, appear to hamper the employment of Li as a practical impurity in ZnSe. First, a net acceptor density of approximately $1 \times 10^{17}$ cm$^{-3}$ seems to represent the upper limit for Li-doping. At higher Li concentrations, strong compensation occurs which renders the ZnSe material highly resistive (see M. A. Haase, H. Cheng, J. M. Depuydt, and J. E. Potts, J. Appl. Phys., 67, 448 (1990)). Secondly, Li impurities are unstable in ZnSe at temperatures above approximately 275° C. The latter problem manifests itself should device processing procedures necessitate heating the material beyond 275° C. P-type behavior has also been reported employing the isoelectronic impurity, oxygen, as a dopant in ZnSe layers grown by molecular beam epitaxy (see K. Akimoto, T. Miyajima, and Y. Mori, Jpn. J. Appl. Phys., 28, L531 (1989)). However, net acceptor concentrations in ZnSe:O layers appear to be low, the largest net acceptor density reported so far being $1.2 \times 10^{16}$ cm$^{-3}$ (see K. Akimoto, T. Miyajima, and Y. Mori, Jpn. J. Appl. Phys., 28, L531 (1989)). Nitrogen has also received attention as a candidate p-type dopant element in ZnSe. For example, Suemune et al (see I. Suemune, K. Yamada, H. Masato, T. Kanda, Y. Kan and M. Yamanishi, Jpn. J. Appl. Phys., 27, L2195 (1988)) reportedly measure hole concentrations around $7 \times 10^{15}$ cm$^{-3}$ in nitrogen-doped (using NH$_3$) lattice-matched $ZnS_{0.06}Se_{0.94}$/GaAs epitaxial layers grown by metal-organic vapor phase epitaxy. Prior art ZnSe layers are highly resistive since only small concentrations of uncompensated nitrogen impurities can be incorporated during crystal growth.

SUMMARY OF THE INVENTION

The present invention provides a method and apparatus of doping IIB-VIA semiconductors with group VA or oxygen free-radicals which yields a net acceptor concentration greater than $5 \times 10^{15}$ cm$^{-3}$ and resistivities less than 15 Ω-cm. (Group IIB elements include Zn, Cd, and Hg, Group VIA elements include O, S, Se, and Te, Group VA elements include N, P, As, and Sb.) Furthermore, the ratio of $N_D/N_A$ is less than or equal to about 0.8. In other words, the doping efficiency is very high. The present invention uses molecular beam epitaxy in which a free-radical source is introduced into the molecular beam epitaxy chamber.

An object of the present invention is to provide a technique for producing conductive p-type IIB-VIA semiconductor films through the use of a free-radical source. These films can be used in the fabrication of pn junction devices such as light emitting diodes and light detectors.

Another object of the present invention is the use of a free-radical source for producing p-type ZnSe which can be used in the fabrication of pn junction devices such as light emitting diodes and laser diodes.

Another object of the present invention provides the use of a free-radical source for producing p-type binary or ternary IIB-VIA semiconductors including $Zn_{1-x}Cd_xSe$, $ZnSe_{1-x}Te_x$, $ZnS_xSe_{1-x}$, $ZnS_{1-x}Te_x$ and $Zn_{1-x}Cd_xS$ (where $\le x \le 1$).

The present invention provides a technique for incorporating oxygen and group VA impurities such as nitrogen, phosphorus, arsenic and antimony into IIB-VIA semiconductors through the use of a free-radical source.

Another object of the present invention is use of a free-radical source for N-doping of ZnSe.

Another object of the present invention is use of a free-radical source for O-doping of ZnSe.

The present invention allows for deposition of conductive p-type films of IIB-VIA semiconductors by the molecular beam epitaxy technique.

The present invention includes a method of doping IIB-VIA semiconductors comprising the steps of injecting a group IIB source into a molecular beam epitaxy chamber; injecting a group VIA source into the molecular beam epitaxy chamber; injecting free-radicals into the molecular beam epitaxy chamber from a source; and growing a IIB-VIA semiconductor layer, doped with free-radicals.

The present invention also includes an electromagnetic radiation transducer comprising a first contact; a p-type ZnSe layer having $N_D/N_A$ less than or equal to about 0.8, the p-type ZnSe layer electrically connected to the first contact; an n-type layer deposited upon the p-type ZnSe layer, wherein the n-type layer interfaces with the p-type ZnSe layer and forms a pn junction; and a second contact electrically connected to the n-type layer.

The present invention includes a method of producing an electromagnetic radiation transducer comprising placing an n-type substrate in a molecular beam epitaxy growth chamber; growing an n-type semiconductor layer upon the n-type substrate; growing a IIB-VIA semiconductor layer upon the n-type semiconductor layer; and doping the IIB-VIA semiconductor layer p-type during the step of growing the IIB-VIA semiconductor layer by injecting a free-radical source into the molecular beam epitaxy growth chamber.

The present invention includes the method of producing an electromagnetic radiation transducer comprising placing a p-type substrate in a molecular beam epitaxy growth chamber; growing a IIB-VIA semiconductor layer upon the p-type substrate; doping the IIB-VIA semiconductor layer p-type during the step of growing the IIB-VIA semiconductor layer by injecting a free-radical source into the molecular beam epitaxy growth chamber; and growing an n-type semiconductor layer upon the IIB-VIA semiconductor layer.

The present invention also includes a method of producing p-type ZnSe comprising injecting a Zn source in a molecular beam epitaxy growth chamber; injecting a Se source into the molecular beam epitaxy growth chamber; injecting a free-radical source in the molecular beam epitaxy growth chamber; and growing a p-type ZnSe layer in the molecular beam epitaxy growth chamber.

The present invention includes an electromagnetic radiation transducer comprising an n-type GaAs substrate having a first face and second face; a first contact electrically connected to the first face of the n-type GaAs substrate; an n-type ZnSe layer having a first face and a second face deposited upon the second face of the n-type GaAs substrate wherein the first face of the n-type ZnSe layer interfaces with the second face of the n-type GaAs substrate; a p-type ZnSe layer having a first face and a second face deposited upon the second face of the n-type ZnSe layer with $N_D/N_A$ less than or equal to about 0.8, wherein the first face of the p-type ZnSe layer interfaces with the second face of the n-type ZnSe layer; and a second contact electrically coupled to the second face of the p-type ZnSe layer.

The invention also includes an electromagnetic radiation transducer comprising a p-type GaAs substrate having a first face and second face; a first contact electrically connected to the first face of the p-type GaAs substrate; a p-type ZnSe layer having a first face and a second face deposited upon the second face of the p-type GaAs substrate with $N_D/N_A$ less than or equal to about 0.8, wherein the first face of the p-type ZnSe layer interfaces with the second face of the p-type GaAs substrate; an n-type ZnSe layer having a first face and a second face deposited upon the second face of the p-type ZnSe layer wherein the first face of the n-type ZnSe layer interfaces with the second face of the p-type ZnSe layer; and a second contact electrically coupled to the second face of the n-type ZnSe layer.

BRIEF DESCRIPTION OF THE DRAWINGS

FIG. 3(b) is a graph of net acceptor density versus depletion width.

DETAILED DESCRIPTION OF THE PREFERRED EMBODIMENTS

Figure 1:
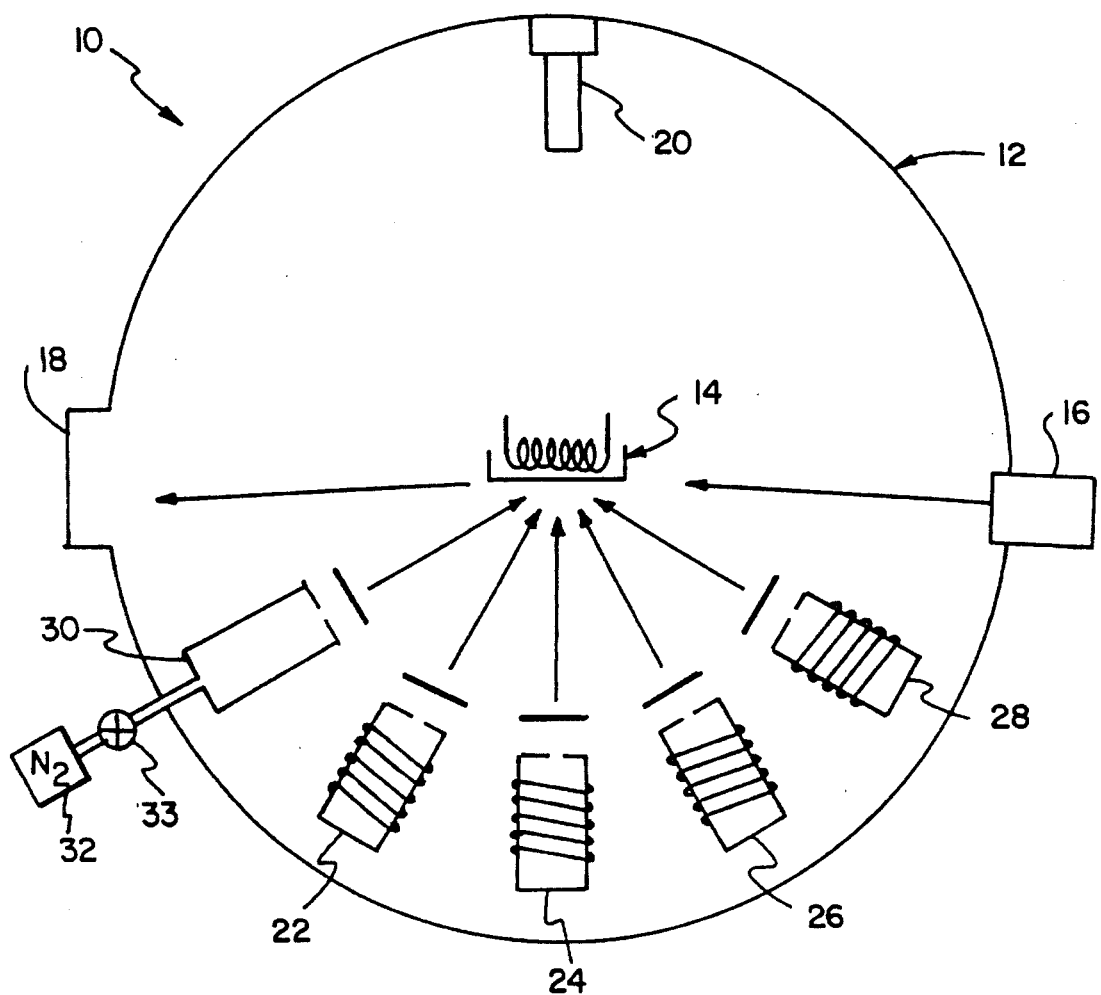
FIG. 1 is a diagram of a molecular beam epitaxy chamber in accordance with the present invention.

The present invention provides a solution to the problem of p-type conduction conversion in ZnSe. Such a breakthrough is essential to the development of practical devices.

In the present invention, an atomic dopant beam (either nitrogen or oxygen), produced by a free-radical source, is used to dope ZnSe during molecular beam epitaxy which produces p-type ZnSe epitaxial thin films. When electromagnetic power at the frequency of 13.52 MHz is coupled to an RF plasma discharge chamber of the free-radical source, atomic dopant species are generated inside the chamber of the free-radical source from a gaseous source of ultra-high purity. A diffuser plate having 18 holes of about 0.3 mm diameter each was used to separate the free-radical source and the molecular beam epitaxy chamber. The amount of the atomic dopant species generated is controlled by the level of the RF power coupled to, and the pressure in the RF plasma discharge chamber. The atomic dopant species, which effuse into the molecular beam epitaxy chamber through openings in the diffuser plate, are used as the dopants during the molecular beam epitaxy growth of ZnSe.

In one embodiment of the present invention, ZnSe thin layers are grown on a well-polished GaAs surface with the surface normal vector essentially along the [001] crystal orientation. There are many suppliers of either the GaAs substrate, available from, for example, Sumitomo Electric Industries, Ltd., 1—1 Koyakita 1-Chome, Itami, Hyogo, 664 Japan, or the GaAs epitaxial layer, available from Spire Corporation, Patriots Park, Bedford, Mass., 01730, for this purpose. Before loading into the molecular beam epitaxy system for the ZnSe growth, the GaAs substrates are degreased in trichloroethane, acetone, and isopropanol, rinsed in deionized water and blown dry by high purity nitrogen gas. The degreased substrates are chemically etched in a solution consisting of six parts of sulfuric acid, one part of hydrogen peroxide and one part of deionized water for several minutes (about two to five minutes). The substrate is rinsed in deionized water and blown dry by high purity nitrogen gas. The degreased and chemically-etched GaAs substrates are then attached to a Mo sample block using molten In of high purity as solder. The substrate assembly is immediately loaded into the molecular beam epitaxy system. The GaAs substrates are heated in the ultra-high vacuum growth chamber to about 610° C. for about one to five minutes to desorb the native oxides and expose the underlying crystalline structure on which the ZnSe with the same crystal structure is to be grown. The typical growth conditions for ZnSe by molecular beam epitaxy are a Zn to Se beam equivalent pressure ratio of 1:2 (in the range of about 1:4 to 2:1) and a growth temperature of 275° C. (in the range of about 250° C. to 400° C.). Typical layer thicknesses and growth rates are 2 μm and 0.5 μm/h (in the range of about 0.4 μm/h to 2.0 μm/h) respectively. The atomic dopants generated by the free-radical source are incorporated into the ZnSe by opening the mechanical shutter which blocks the line of sight path between the free-radical source and the heated substrates.

The major focus in recent years regarding research on the wide-bandgap IIB-VIA compound semiconductor, ZnSe ($E_g \cong 2.67$ eV at room temperature), has been on producing low resistivity p-type material. The present invention provides a method and apparatus for the in-situ production of epitaxial structures comprising ZnSe pn junctions. This is useful in the fabrication of efficient light-emitting devices, such as light-emitting diodes and diode lasers which operate in the blue region of the visible spectrum.

In accordance with the present invention, either nitrogen or oxygen are an excellent p-type dopant element in ZnSe. In addition to providing large net acceptor densities (greater than about $5 \times 10^{15}$ cm$^{-3}$ and low compensation ($N_D/N_A$ less than about 0.8)), nitrogen and oxygen are stable in ZnSe at temperatures up to 375° C.

The present invention provides a novel technique to incorporate large concentrations of net nitrogen acceptor impurities in ZnSe/GaAs epitaxial layers which involves nitrogen atom beam doping during molecular beam epitaxial growth. Net acceptor densities as large as $4.9 \times 10^{17}$ cm$^{-3}$ have been measured in the resultant p-type ZnSe material. This represents the highest net acceptor density with $N_D/N_A$ less than about 0.8 reported to-date for nitrogen doped ZnSe epitaxial layers grown by molecular beam epitaxy.

FIG. 1 shows a molecular beam epitaxy system made in accordance with the present invention. Molecular beam epitaxy system 10 includes a molecular beam epitaxy chamber 12 which encloses a substrate 14. Molecular beam epitaxy chamber 12 includes an electron gun 16, a phosphorus screen 18 and a flux monitor 20. Effusion cells 22, 24, 26, and 28 are carried in molecular beam epitaxy chamber 12. In accordance with the present invention, effusion cells 22, 24, 26, and 28 may comprise, for example, effusion cells for Zn, Se, and ZnCl$_2$. Molecular beam epitaxy system 10 also includes a free-radical source 30, in accordance with the present invention. Free-radical source 30 may comprise a source of any group VA or oxygen free-radicals. For example, free-radical source 30 may provide a source of nitrogen free-radicals, in which free-radical source 30 is supplied with ultra-pure N$_2$ from an ultra-pure N$_2$ source 32 through a valve 33. Free-radical source 30 is available from Oxford Applied Research Ltd. (Oxfordshire, UK). Free-radical source 30 might comprise other types of sources which produce free-radicals. For example, an electron cyclotron resonance (ECR) free-radical source may be used (available from, for example, Wavemat, Inc., 44780 Helm Street, Plymouth, Mich.). A microwave cracker coupled into the gas source through a microwave tube may be used to produce free-radicals. A DC plasma discharge chamber may also be used. Furthermore, any appropriate thermal cracker or disassociation cell (available from, for example, EPI, 261 East Fifth Street, St. Paul, Minn. 55101) may be used.

ZnSe layers were grown on GaAs substrates in a molecular beam epitaxy system in accordance with the present invention. These layers were grown at a substrate temperature of 275° C. with a Zn to Se beam equivalent pressure ratio of 1:2 (typical layer thicknesses and growth rates were 2 μm and 0.5 μm/h, respectively). P-type doping of the ZnSe layers was achieved by a free-radical source which was incorporated in the molecular beam epitaxy system, rather than a conventional effusion source. The free-radical source provided a flux of atomic nitrogen (together with a much larger flux of non-dissociated N$_2$) created in a RF plasma discharge chamber. A RF frequency of 13.5 MHz was used to generate nitrogen atoms from a gaseous source of ultra-pure N$_2$. The atomic nitrogen flux level was controlled by suitably adjusting the intensity of the RF plasma discharge.

Figure 2A:
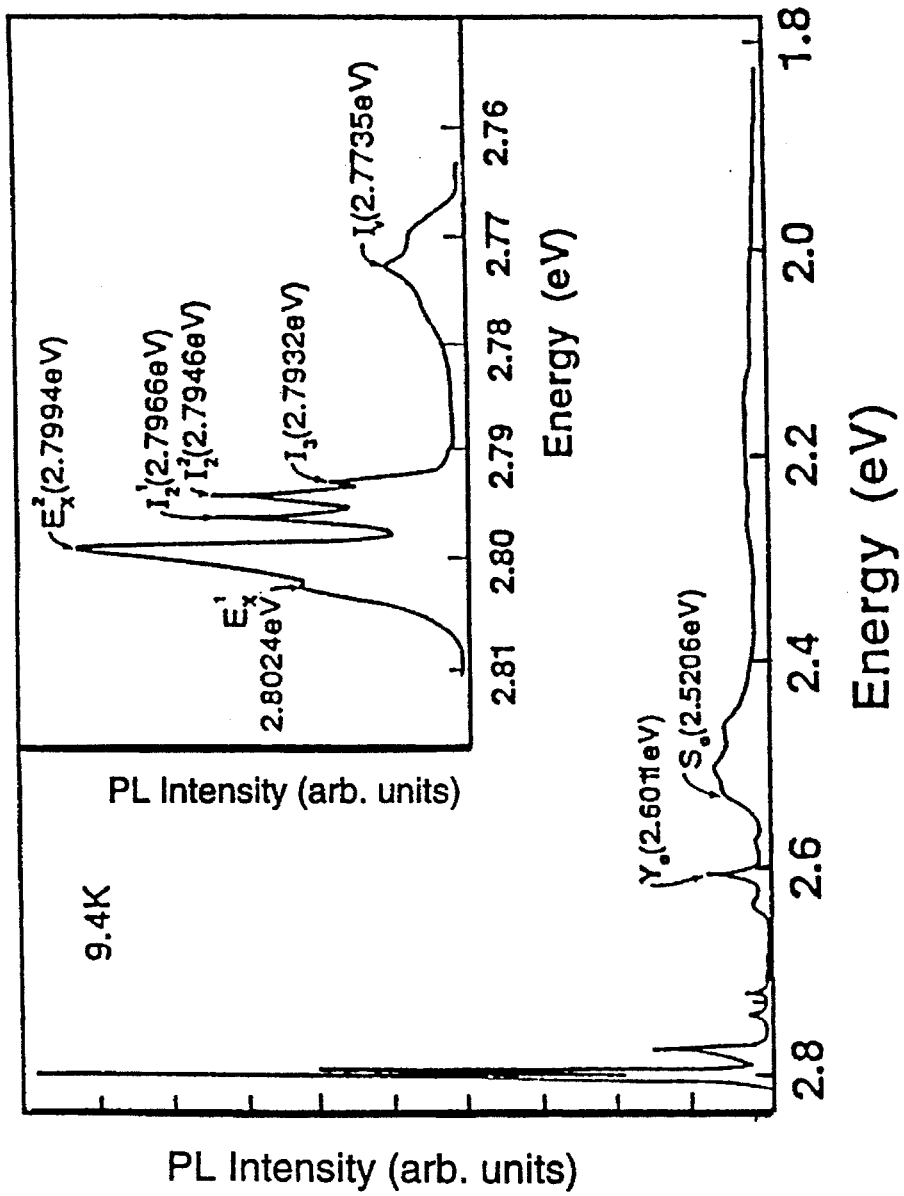
FIGS. 2(a) and 2(b) are graphs of PL intensity versus energy.
Figure 2B:
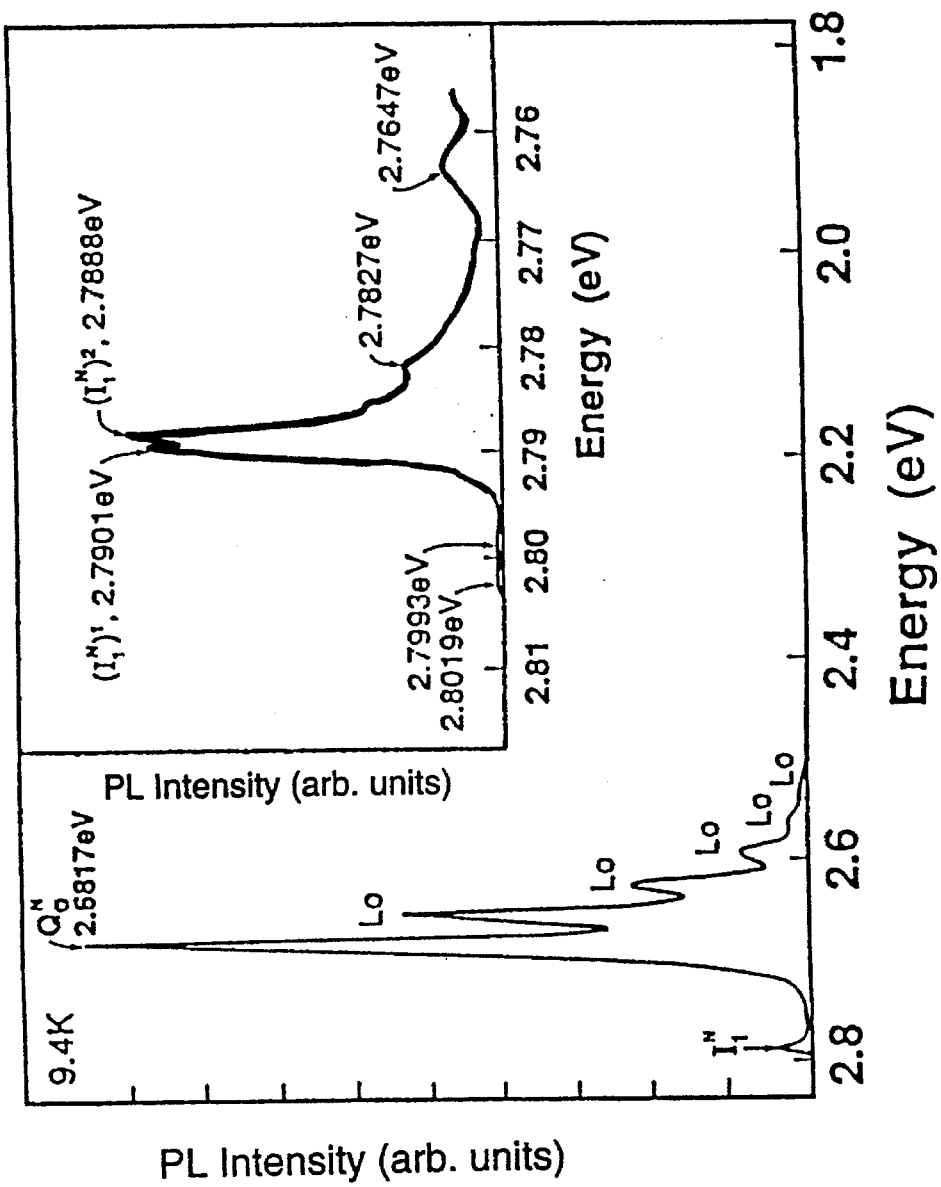

The nitrogen actively incorporated into the ZnSe was much greater using the free-radical atomic beam than that of molecular nitrogen, as evidenced by comparing 10K photoluminescence (PL) spectra recorded from ZnSe layers grown with a flux of N$_2$ only and with a flux of N+N$_2$. As shown in FIG. 2 (a), the 10K PL spectrum recorded from a ZnSe layer grown using a flux of N$_2$ only, (in this case an equilibrium background pressure of N$_2$ in the molecular beam epitaxy chamber of $5 \times 10^{-7}$ Torr was maintained) appears to be identical to that recorded from undoped ZnSe heteroepitaxial layers (see R. M. Park, C. M. Rouleau, M. B. Troffer, T. Koyama, and T. Yodo, J. Mater. Res., 5, 475 (1990)). The dominant peaks in the excitonic regime are the split free-exciton ($E_x$) and donor-bound-exciton ($I_2$) transitions, the splitting being due to the thermal expansion coefficient mismatch between ZnSe and GaAs which renders the ZnSe layers under in-plane biaxial tension (see K. Shahzad, D. J. Olego, D. A. Cammack, Phys. Rev. B 39, 13016 (1989)). Consequently, at such low background N$_2$ partial pressures, molecular nitrogen is completely unreactive at the ZnSe surface. The situation changes dramatically, however when a plasma discharge is created in the free-radical source, as shown in the 10K spectrum of FIG. 2(b). Again the background N$_2$ partial pressure in the molecular beam epitaxy chamber during growth was $5 \times 10^{-7}$ Torr with power applied to the RF plasma discharge. The excitonic regime is dominated by split acceptor-bound-exciton ($I_1^N$) transitions due to the incorporation of nitrogen acceptor impurities (see P. J. Dean, W. Stutius, G. F. Neumark, B. J. Fitzpatrick, and R. N. Bhargava, Phys. Rev. B 27, 2419 (1983)). In addition, the complete PL spectrum is dominated by donor-to-acceptor (D-A) transitions ($Q_o^N$-represents the no phonon transition, with several LO phonon replicas of $Q_o^N$ also indicated) as opposed to excitonic transitions. Thus, the rate of substitutional incorporation of atomic nitrogen is much greater than that of molecular nitrogen at the growing ZnSe surface. The sample from which the PL spectrum shown in FIG. 2(b) was obtained was found to have a net acceptor concentration of $1 \times 10^{17}$ cm$^{-3}$.

Net acceptor concentrations, $N_A-N_D$, in the nitrogen doped ZnSe/GaAs layers were determined using capacitance-voltage (C-V) profiling. Since the ZnSe epitaxial layers were grown on semi-insulating GaAs, planar profiling between two Schottky contacts on the ZnSe surface was carried out. The surface contact pattern consisted of a series of 762 μm diameter Cr/Au dots physically isolated from a large Cr/Au surrounding electrode. The separation between the inner (dot) electrodes and the outer electrode was 25 μm, a small separation being necessary in order to maintain a low series resistance. The contact pattern was created by thermally evaporating 75 Å of Cr followed by 1000 Å of Au and performing photolithographic and lift-off processes. In all of these measurements the outer electrode was held at ground potential and bias was applied to the inner Schottky contact.

Figure 3A:
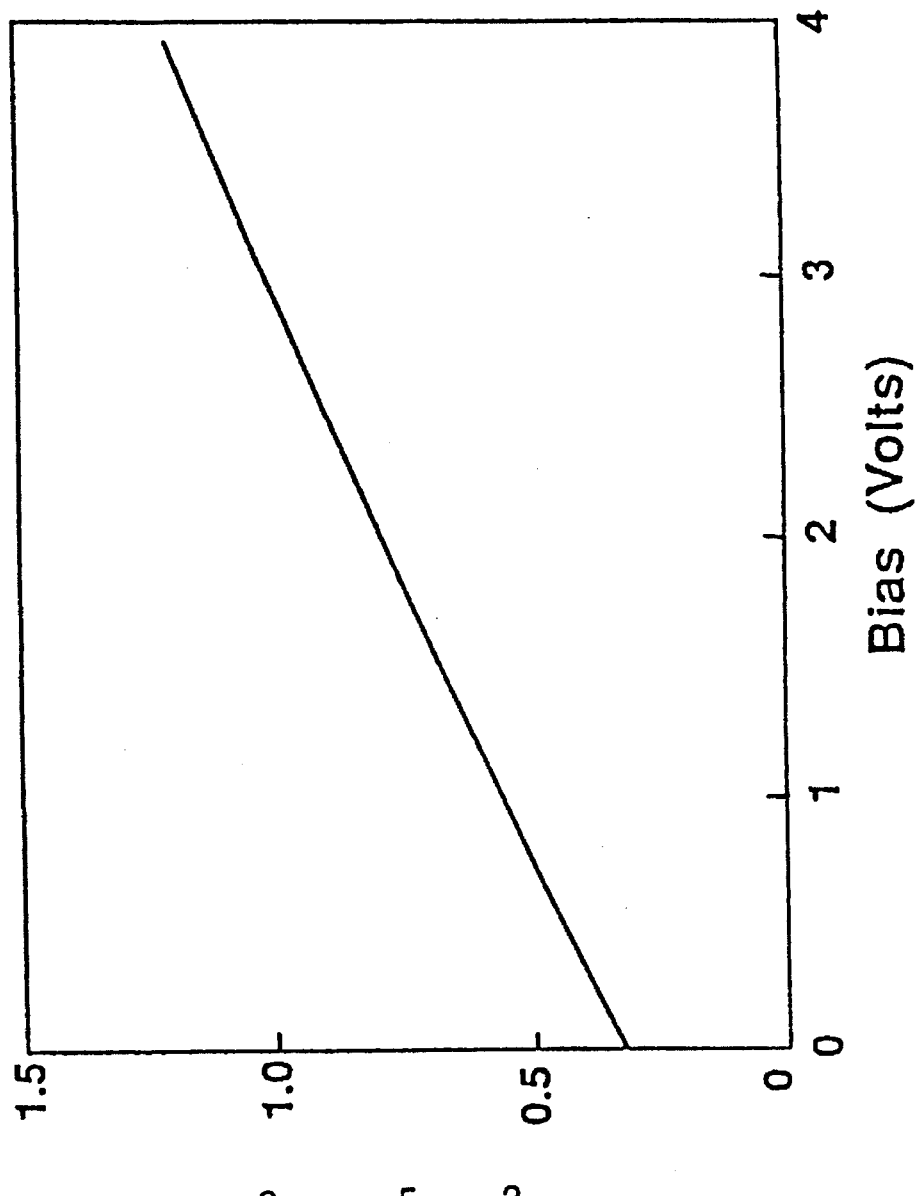
FIG. 3(a) is a graph of $1/C^2$ versus bias voltage.

With this sign convention the majority carrier type is given by the sign of the slope of the $1/C^2$ versus V plot; a positive slope would indicate the material to be p-type. The net acceptor ($N_A-N_D$) concentration is proportional to the slope of $1/C^2$ versus V. The $1/C^2$ versus V plot and the $N_{A-ND}$ versus depletion width profile obtained from a heavily-doped ZnSe layer are illustrated in FIGS. 3(a) and 3(b), respectively. As shown in FIGS. 3(a) and 3(b), the material is p-type with a net acceptor concentration around $3.4\times10^{17}$ cm$^{-3}$. As shown in FIG. 3(b), the doping profile is rather flat from zero bias (0.068 μm) out to where reverse bias breakdown occurs (1.126 μm). Breakdown occurred at 3.8 V which is consistent with avalanche breakdown in ZnSe material doped at this level, ie, $3.4\times10^{17}$ cm$^{-3}$ p-type.

Further evidence of the p-type nature of the nitrogen doped ZnSe material was obtained through the fabrication of blue light-emitting diodes based on epitaxially grown ZnSe: N/ZnSe: Cl pn homojunctions. The n-type ZnSe layers in these pn junctions were grown using Cl as the dopant element, the source of the Cl atoms being a ZnCl$_2$ effusion cell incorporated in the molecular beam epitaxy system.

A number of ZnSe samples grown using molecular beam epitaxy were tested. The results were as follows:

1. Undoped ZnSe:
   Zn to Se beam equivalent pressure ratio: 1:2
   Growth Temperature: 275° C.
   Results: Low temperature photoluminescence spectrum indicated sample was not p-type. C-V measurement indicated sample was insulating.

2. Doped ZnSe using N$_2$ with no RF power to free-radical source:
   Zn to Se beam equivalent pressure ratio: 1:2
   Growth Temperature: 275° C.
   RF power: 0 watts
   Background pressure: $5\times10^{-7}$ Torr
   Results: Low temperature photoluminescence spectrum indicated sample was not p-type. C-V measurements indicated sample was insulating.

3. Doped ZnSe using N$_2$ with RF power to free-radical source:
   Zn to Se beam equivalent pressure ratio: 1:2
   Growth temperature: 275° C.
   RF power: 320 watts
   Background pressure: $5\times10^{-7}$ Torr
   Results: Low temperature photoluminescence spectrum, current-voltage measurement and capacitance-voltage measurement indicated that sample was p-type. $N_D/N_A \leq 0.8$ (high doping efficiency) and $N_A-N_D=3.4\times10^{17}$ cm$^{-3}$.

4. Doped ZnSe using O$_2$ with RF power to free-radical source:
   Zn to Se beam equivalent pressure ratio: 1:2
   Growth temperature: 275° C.
   RF power: 320 watts
   Background pressure: $5\times10^{-7}$ Torr
   Results: Low temperature photoluminescence spectrum, current-voltage measurement, and capacitance-voltage measurement indicated that sample was p-type and $N_A-N_D=3.0\times10^{16}$ cm$^{-3}$.

Figure 4A:
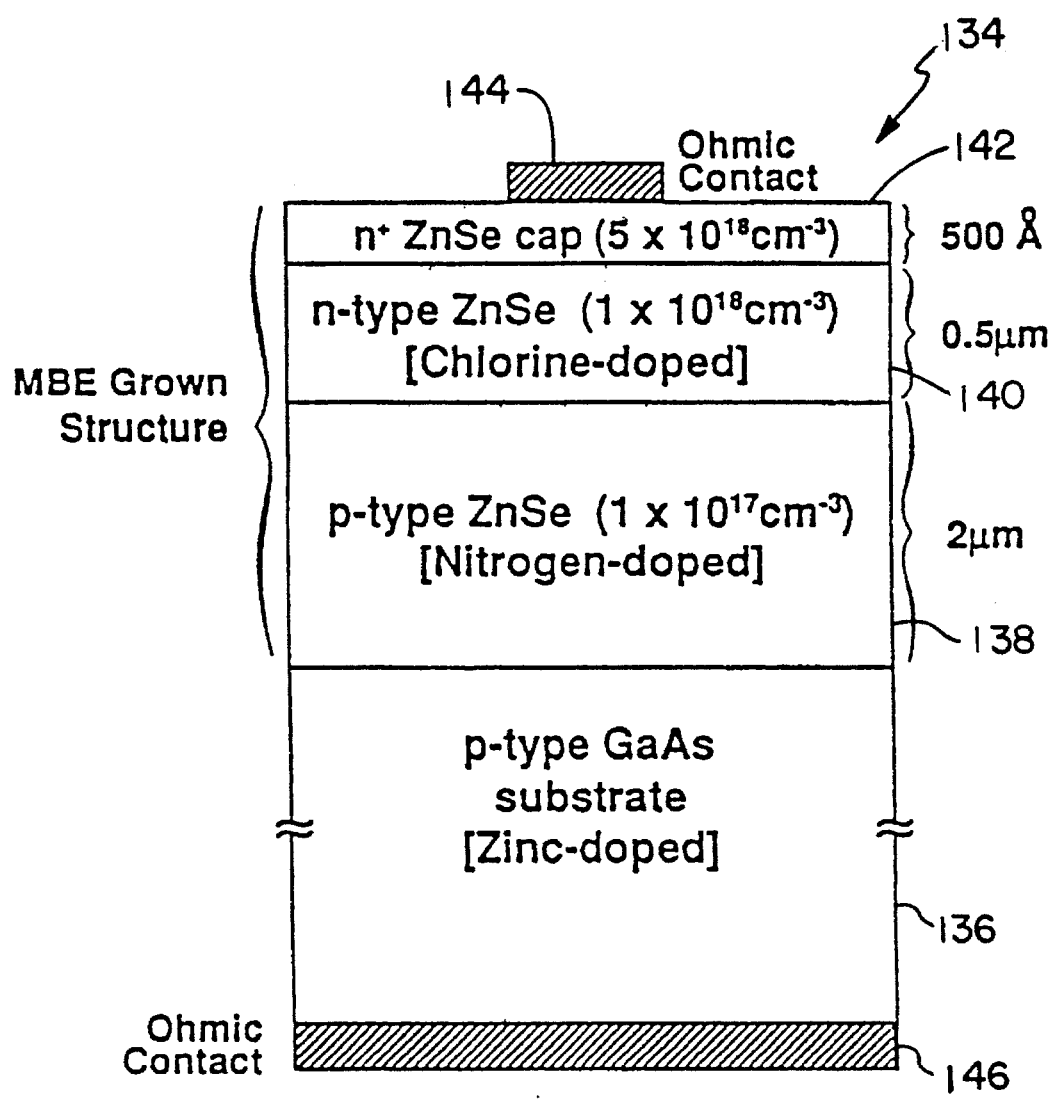
FIG. 4(a) is a light emitting diode made in accordance with the present invention.

A typical light-emitting diode device structure in accordance with the present invention is shown schematically in FIG. 4(a). FIG. 4(a) shows a light emitting diode 34. Light emitting diode 34 includes a p-type GaAs substrate 36. P-type GaAs substrate 36 forms the base for molecular beam epitaxial growth. A p-type ZnSe nitrogen doped layer 38 is deposited upon p-type GaAs substrate 36. P-type ZnSe layer 38 is deposited in accordance with the present invention using a nitrogen free-radical source. An n-type ZnSe chlorine doped layer 40 is deposited upon p-type ZnSe layer 38. An n$^+$ ZnSe cap layer 42 is deposited upon n-type ZnSe layer 40. The deposition of layers 38, 40, and 42 is through molecular beam epitaxial growth. Ohmic contacts 44 and 46 form electrical contacts to n$^+$ ZnSe cap layer 42 and p-type GaAs substrate 36, respectively.

In a preferred embodiment, p-type ZnSe layer 38 has a thickness of 2 μm and has a net acceptor concentration of $1\times10^{17}$ cm$^{-3}$. N-type ZnSe layer 40 has a thickness of 5.0 μm and a net donor concentration of $1\times10^{18}$ cm$^{-3}$. The n$^+$ ZnSe cap layer 42 has a thickness of 500 Å and a net donor concentration of $5\times10^{18}$ cm$^{-3}$.

FIG. 4(a) shows the p-type ZnSe layer is grown first on a p$^{+1}$-type GaAs substrate. This type of "buried p-type layer" structure avoids the serious problems presently associated with ohmic contact formation to p-type ZnSe (See M. A. Haase, H. Cheng, J. M. DePuydt, and J. E. Potts, J. Appl. Phys., 67, 448 (1990)). However, a disadvantage with this device design is that a large hole barrier exists at the p$^{+1}$-GaAs/p-ZnSe hetero-interface (see L. Kassel, H. Abad, J. W. Garland, P. M. Raccah, J. E. Potts, M. A. Haase, and H. Cheng, Appl. Phys. Lett., 56 42 (1990)). In this type of device, hole injection across the p$^{+1}$-GaAs/p-ZnSe hetero-interface is only realized at avalanche breakdown. Consequently, large turn-on voltages are required to observe electroluminescence associated with the ZnSe pn homojunction.

Light-emitting diode fabrication was accomplished using conventional photolithographic techniques with device isolation being achieved by wet chemical etching to form 400 μm diameter mesas. The top electrode metalization was ring shaped and was patterned by vacuum evaporation and lift-off. Ultrasonic gold ball bonding was used to make contact to the devices for electroluminescence characterization.

Figure 4B:
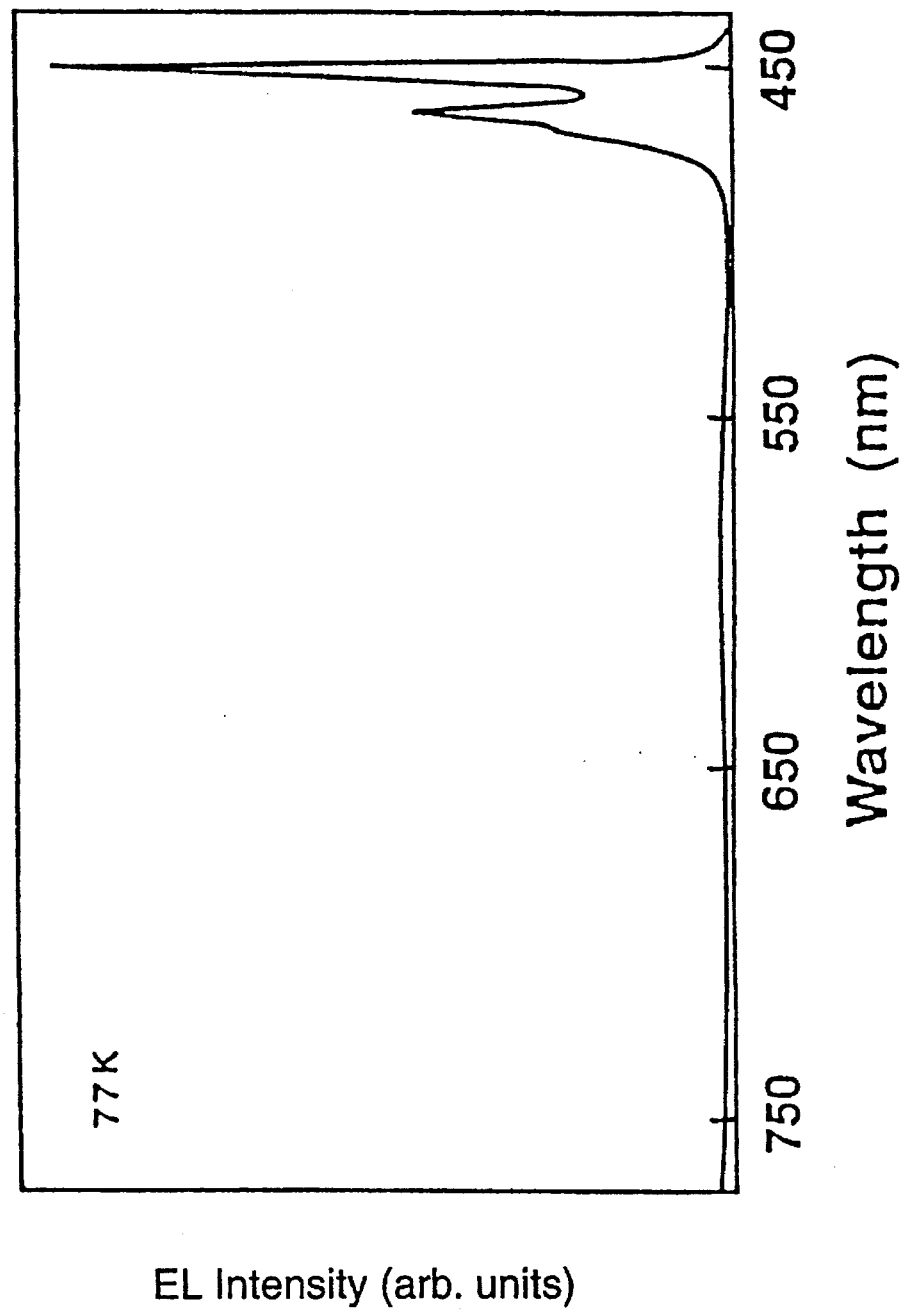
FIG. 4(b) is a graph of EL intensity versus wavelength at 77K.

A typical electroluminescence spectrum recorded at 77K for light emitting diode 34 shown in FIG. 4(a), is illustrated in FIG. 4(b). The device operating voltage and current were 13.5 V and 40 mA, respectively, for the spectrum shown in FIG. 4(a). As can be seen from FIG. 4(b), the visible electroluminescence is dominated by blue emission, the spectrum comprising a number of resolved lines principally at 447.7 nm, 459.6 nm and 464.7 nm. The two highest energy peaks in the spectrum correspond closely in energy to the electroluminescence peaks observed at 77K from blue light-emitting diodes fabricated using a nitrogen-ion implantation and annealing procedure as reported by Akimoto et al (See K. Akimoto, T. Miyajima, and Y. Mori, Jpn. J. Appl. Phys., 28, L528 (1989)). Infrared emission at 844 nm was also recorded from these devices (simultaneously with the blue emission) which appears to be the result of electron injection into the p$^{+1}$-type GaAs material under avalanche breakdown conditions at the hetero-junction (not shown in FIG. 4(b)).

Figure 5:
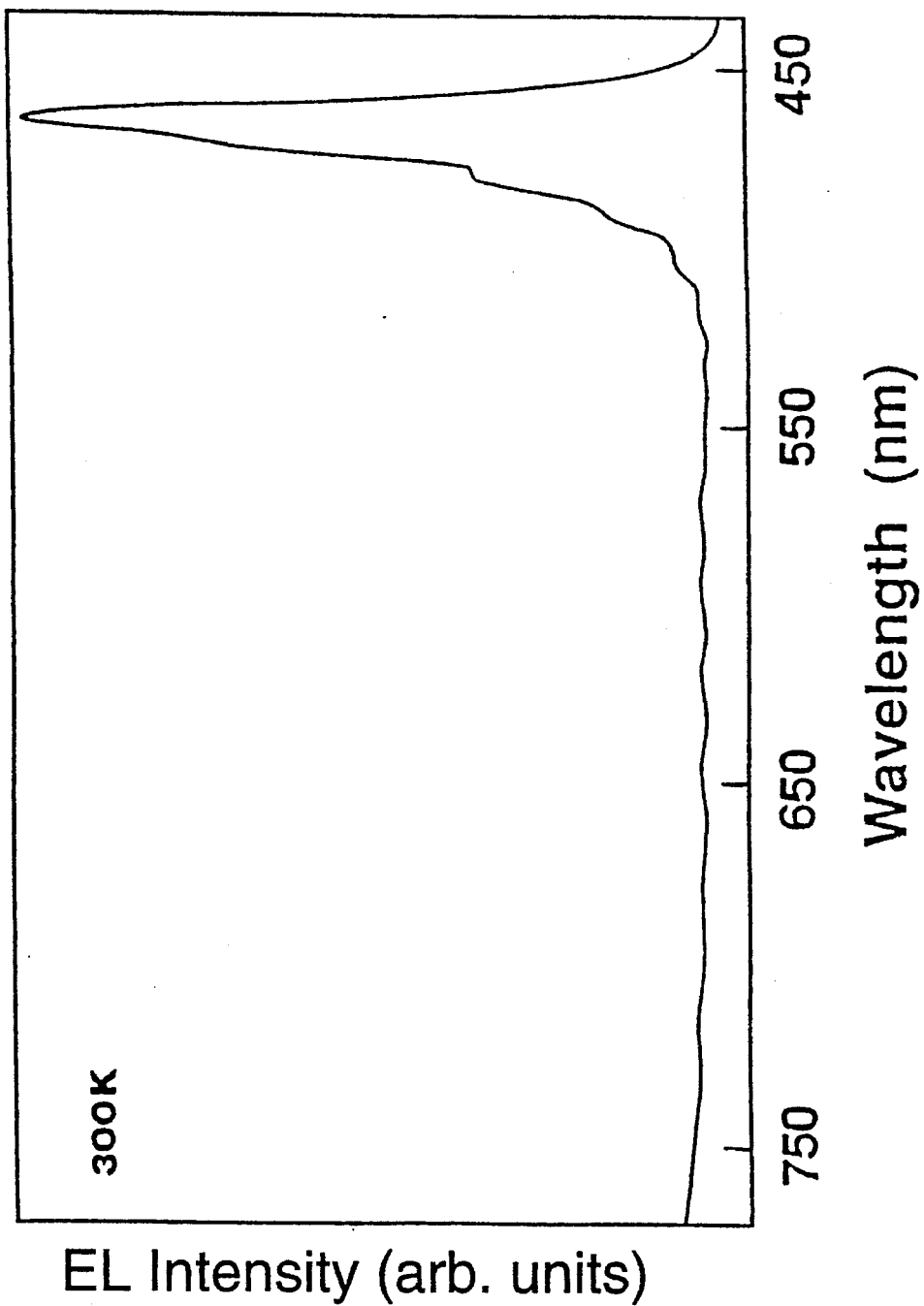
FIG. 5 is a graph of EL intensity versus wavelength at room temperature.

An electroluminescence spectrum recorded at room temperature from the device structure illustrated in FIG. 4(a) (visible region only) is shown in FIG. 5. As can be seen from the figure, dominant emission in the blue region of the visible spectrum is observed, peaking in intensity at a wavelength of 465 nm. For the particular spectrum shown in FIG. 5, the voltage applied and current drawn were 22 V and 20 mA, respectively.

Figure 6:
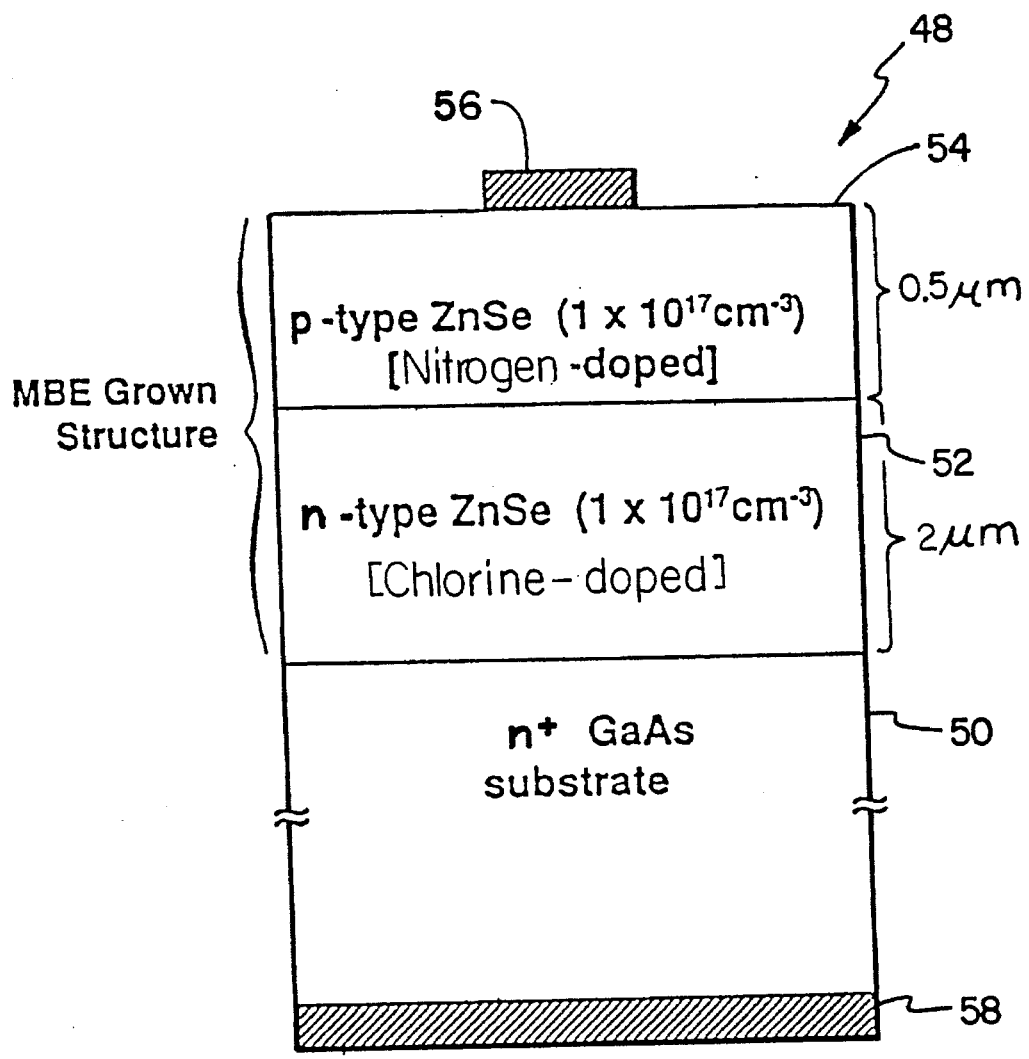
FIG. 6 is a light emitting diode made in accordance with the present invention.

FIG. 6 shows a light emitting diode 48 made in accordance with the present invention. Light emitting diode 48 is a p on n device which operates similar to light emitting diode 34 of FIG. 4(a). Light emitting diode 48 includes an $n^+$ GaAs substrate 50, an n-type ZnSe layer 52 and p-type ZnSe layer 54. Contacts 56 and 58 make electrical contact with p-type ZnSe layer 54 and $n^+$ GaAs substrate 50. The p-type ZnSe layer 54 is deposited using molecular beam epitaxy and a group VA free-radical source in accordance with the present invention. In one embodiment, diode 48 shown in FIG. 6 n-type ZnSe layer 52 has a net donor concentration of about $1 \times 10^{18}$ cm$^{-3}$ and a thickness of about 2.0 µm and p-type ZnSe layer 54 has a net acceptor concentration of about $1 \times 10^{17}$ cm$^{-3}$ and a thickness of 5.0 µm.

The present invention provides a method and apparatus for producing conductive p-type IIB-VIA semiconductors films using a free-radical source. Using the present invention, n-type IIB-VIA semiconductor film may also be produced. The resultant IIB-VIA semiconductor film may be used in pn junction devices such as light emitting diodes and light detectors as well as diode lasers and transistors. Using the present invention, a free-radical source is introduced into a molecular beam epitaxy growth chamber to provide a dopant to a IIB-VIA semiconductor during molecular beam epitaxial growth. The free-radical source may be nitrogen, phosphorus, arsenic, and antimony. Oxygen may also be used as a suitable free-radical source. The present invention may be used for N-doping and O-doping of ZnSe. In accordance with the present invention, p-type ternary IIB-VIA semiconductors including $Zn_{1-x}Cd_xSe$, $ZnSe_{1-x}Te_x$, $ZnSe_{1-x}S_x$, $ZnS_{1-x}Te_x$, and $Zn_{1-x}Cd_xS$.

Although the present invention has been described with reference to preferred embodiments, workers skilled in the art will recognize that changes may be made in form and detail without departing from the spirit and scope of the invention. For example, the free-radical source may be a source of any group VA free-radicals, and may provide a dopant for any IIB-VIA semiconductors.

What is claimed is:

1. An electromagnetic radiation transducer comprising:
   a first contact;
   a p-type IIB-VIA semiconductor layer formed by doping IIB-VIA semiconductor with group VA neutral free-radicals selected from the group consisting of N, P, As, Sb and Bi generated by a free-radical source during fabrication by molecular beam epitaxy, the p-type IIB-VIA semiconductor layer electrically connected to the first contact;
   an n-type layer operably coupled to the p-type IIB-VIA semiconductor layer, wherein the n-type layer interacts with the p-type IIB-VIA semiconductor layer and forms a pn junction;
   a second contact electrically connected to the n-type layer; and
   wherein the neutral free-radicals which dope the p-type IIB-VIA semiconductor layer enable the electromagnetic radiation transducer to have a room temperature (300° K.) electroluminescent (EL) spectrum having a maximum intensity at wave lengths of less than 550 nanometers and provide a net acceptor concentration which is greater than about $5 \times 10^{15}$ cm$^{-3}$.

2. The electromagnetic radiation transducer of claim 1 wherein the p-type IIB-VIA semiconductor layer is doped with group VA free-radicals.

3. The electromagnetic radiation transducer of claim 2 wherein the p-type IIB-VIA semiconductor layer is doped with nitrogen free-radicals.

4. The electro magnetic radiation transducer of claim 1 wherein the p-type IIB-VIA semiconductor layer is doped with oxygen free-radicals.

5. The electromagnetic radiation transducer of claim 1 wherein neutral free-radicals are generated with an rf plasma discharge free-radical source.

6. The electromagnetic radiation transducer of claim 1 wherein neutral free-radicals are generated with an electron cyclotron resonance free-radical source.

7. The electromagnetic radiation transducer of claim 1 wherein the p-type IIB-VIA semiconductor layer has a resistivity of less than about 15 Ω-cm.

8. The electromagnetic transducer of claim 1 wherein the p-type IIB-VIA semiconductor layer comprises ZnSe.

9. The electromagnetic transducer of claim 1 wherein the p-type IIB-VIA semiconductor layer has an $N_D/N_A$ ratio of less than or equal to about 0.8.

10. An electromagnetic radiation transducer comprising:
    an n-type GaAs substrate having a first face and a second face;
    a first contact electrically connected to the first face of the n-type GaAs substrate;
    an n-type IIB-VIA semiconductor layer having a first face and a second face operably coupled with the second face of the n-type GaAs substrate wherein the first face of the n-type IIB-VIA semiconductor layer interacts with the second face of the n-type GaAs substrate;
    a p-type IIB-VIA semiconductor layer having a first face and a second face operably coupled with the second face of the n-type IIB-VIA semiconductor layer formed by doping IIB-VIA semiconductor with group VA neutral free-radicals selected from the group consisting of N, P, As, Sb and Bi generated by a free-radical source during fabrication by molecular beam epitaxy, wherein the first face of the p-type IIB-VIA semiconductor layer interacts with the second face of the n-type IIB-VIA semiconductor layer;
    a second contact electrically coupled to the second face of the p-type IIB-VIA semiconductor layer; and
    wherein the neutral free-radicals which dope the p-type IIB-VIA semiconductor layer provide a net acceptor concentration which is greater than about $5 \times 10^{15}$ cm$^{-3}$ and enable the electromagnetic radiation transducer to have a room temperature (300° K.) electroluminescent (EL) spectrum having a maximum intensity at wave lengths of less than 550 nanometers.

11. The electromagnetic radiation transducer of claim 2 wherein the p-type IIB-VIA semiconductor layer has a resistivity of less than about 15 Ω-cm.

12. The electromagnetic radiation transducer of claim 10 wherein neutral free-radicals are generated with an rf plasma discharge free-radical source.

13. The electromagnetic radiation transducer of claim 10 wherein neutral free-radicals are generated with an electron cyclotron resonance free-radical source.

14. The electromagnetic transducer of claim 10 wherein the p-type IIB-VIA semiconductor layer comprises ZnSe.

15. The electromagnetic transducer of claim 10 wherein the p-type IIB-VIA semiconductor layer has an $N_D/N_A$ ratio of less than or equal to about 0.8.

16. An electromagnetic radiation transducer comprising:

a p-type GaAs substrate having a first face and a second face;

a first contact electrical coupled to the first face of the p-type GaAs substrate;

a p-type IIB-VIA semiconductor layer having a first face and a second face operably coupled with the second face of the p-type GaAs substrate formed by doping ZnSe with group VA neutral free-radicals selected from the group consisting of N, P, As, Sb and Bi generated by a free-radical source during fabrication by molecular beam epitaxy, wherein the first face of the p-type IIB-VIA semiconductor layer interacts with the second face of the p-type GaAs substrate;

an n-type IIB-VIA semiconductor layer having a first face and a second face operably coupled with the second face of the p-type IIB-VIA semiconductor layer wherein the first face of the n-type IIB-VIA semiconductor layer interfaces with the second face of the p-type IIB-VIA semiconductor layer;

a second contact electrically coupled to the second face of the n-type IIB-VIA semiconductor layer; and wherein the neutral free-radicals which dope the p-type IIB-VIA semiconductor layer provide a net acceptor concentration which is greater than about $5 \times 10^{15}$ cm$^{-3}$ and enable the electromagnetic radiation transducer to have a room temperature (300° K.) electroluminescent (EL) spectrum having a maximum intensity at wave lengths of less than 550 nanometers.

17. The electromagnetic radiation transducer of claim 16 wherein the p-type IIB-VIA semiconductor layer has a resistivity of less than about 15 Ω-cm.

18. The electromagnetic radiation tranducer of claim 16 wherein free-radicals are generated with and rf plasma discharge free-radical source.

19. The electromagnetic radiation transducer of claim 16 wherein neutral free-radicals are generated with an electron cyclotron resonance free-radical source.

20. The electromagnetic transducer of claim 16 wherein the p-type IIB-VIA semiconductor layer comprises ZnSe.

21. The electromagnetic transducer of claim 16 wherein the p-type IIB-VIA semiconductor layer has an $N_D/N_A$ ratio of less than or equal to about 0.8.

* * * * *

UNITED STATES PATENT AND TRADEMARK OFFICE
CERTIFICATE OF CORRECTION

PATENT NO. : 5,574,296
DATED : November 12, 1996
INVENTOR(S) : Robert M. Park et al.

It is certified that error appears in the above-indentified patent and that said Letters Patent is hereby corrected as shown below:

On the Title Page of the Patent, under Assignee, after "Minnesota Mining and Manufacturing Company, St. Paul, Minn.," insert --and University of Florida, Gainesville, Florida--.

Signed and Sealed this

Sixteenth Day of December, 1997

Attest:

BRUCE LEHMAN

*Attesting Officer*            *Commissioner of Patents and Trademarks*